(12) United States Patent
Yoo et al.

(10) Patent No.: US 11,887,656 B2
(45) Date of Patent: Jan. 30, 2024

(54) MEMORY FOR IMPROVING EFFICIENCY OF ERROR CORRECTION

(71) Applicant: SK hynix Inc., Gyeonggi-do (KR)

(72) Inventors: Min Soo Yoo, Gyeonggi-do (KR); Eun Hyup Doh, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 136 days.

(21) Appl. No.: 17/523,669

(22) Filed: Nov. 10, 2021

(65) Prior Publication Data
US 2022/0406362 A1    Dec. 22, 2022

(30) Foreign Application Priority Data

Jun. 17, 2021   (KR) .......................... 10-2021-0078734

(51) Int. Cl.
*G11C 7/00*      (2006.01)
*G11C 11/4091*   (2006.01)
*G11C 11/4096*   (2006.01)
*G11C 11/4094*   (2006.01)
*G11C 11/408*    (2006.01)

(52) U.S. Cl.
CPC ...... *G11C 11/4091* (2013.01); *G11C 11/4085* (2013.01); *G11C 11/4094* (2013.01); *G11C 11/4096* (2013.01)

(58) Field of Classification Search
CPC ................................................ G11C 11/4085
See application file for complete search history.

(56) References Cited

U.S. PATENT DOCUMENTS

| 6,538,914 B1* | 3/2003 | Chung ................ G11C 11/22 365/63 |
| 2019/0279712 A1* | 9/2019 | Siau .................... G11C 5/08 |
| 2022/0093164 A1* | 3/2022 | Chi .................. G11C 11/4097 |

FOREIGN PATENT DOCUMENTS

KR    10-2090874 B1    3/2020

OTHER PUBLICATIONS

Priyanka P. Ankolekar, Multibit Error-Correction Methods for Latency-Constrained Flash Memory Systems, IEEE Transactions on Device and Materials Reliability, Mar. 2010, p. 33-39, vol. 10, No. 1.

\* cited by examiner

*Primary Examiner* — Min Huang
(74) *Attorney, Agent, or Firm* — IP & T GROUP LLP

(57) ABSTRACT

A memory includes: a plurality of row lines; a plurality of column lines; and a plurality of memory cells each of which is coupled to one row line among the row lines and one column line among the column lines, wherein memory cells corresponding to a row line which is selected based on a row address among the row lines are simultaneously activated, and data are read from memory cells corresponding to column lines which are selected based on a column address among the activated memory cells, and the selected column lines are not adjacent to each other.

6 Claims, 4 Drawing Sheets

MEMORY FOR IMPROVING EFFICIENCY OF ERROR CORRECTION

CROSS-REFERENCE TO RELATED APPLICATIONS

The present application claims priority to Korean Patent Application No. 10-2021-0078734, filed on Jun. 17, 2021, which is incorporated herein by reference in its entirety.

BACKGROUND

1. Field

Various embodiments of the present invention relate to a memory.

2. Description of the Related Art

In the early stage of the semiconductor memory device industry, there were many originally good dies on the wafers, which meant that memory chips were produced with no defective memory cells through a semiconductor fabrication process. However, as the capacity of memory devices increases, it becomes difficult to fabricate a memory device that does not have any defective memory cells. Therefore, it may be said that currently there is substantially no chance that a memory device is fabricated without any defective memory cells. To address this issue, a repair method of including redundant memory cells in a memory device and replacing defective memory cells with the redundant memory cells is being used.

In another method, an error correction circuit (ECC circuit) for correcting errors is used to correct errors occurring in memory cells.

SUMMARY

Embodiments of the present invention are directed to a method for increasing the efficiency of error correction in a memory.

In accordance with an embodiment of the present invention, a memory includes: a plurality of row lines; a plurality of row lines; a plurality of column lines; and a plurality of memory cells, each of which coupled to one row line among the row lines and one column line among the column lines, wherein the memory is suitable for simultaneously activating memory cells corresponding to a row line which is selected based on a row address among the row lines, wherein the memory is further suitable for reading data from memory cells corresponding to column lines which are selected based on a column address, among the activated memory cells, and wherein the selected column lines are not adjacent to each other.

In accordance with another embodiment of the present invention, a memory includes: a plurality of row lines; a plurality of column lines; and a plurality of memory cells, each of which is coupled to one row line among the row lines and one column line among the column lines, wherein the memory is suitable for allocating, to different data chunks, memory cells corresponding to neighboring column lines among the column lines during a read operation and a write operation.

In accordance with yet another embodiment of the present invention, a memory includes: a cell array including a plurality of memory cells that are arranged in a plurality of rows and a plurality of columns; a first bit line sense amplifier array positioned on one side of the cell array and suitable for amplifying data of memory cells of even columns of a selected row among the rows of the memory cells; and a second bit line sense amplifier array positioned on another side of the cell array and suitable for amplifying data of memory cells of odd columns of the selected row of the memory cells, wherein the memory is suitable for performing a read operation of outputting data from only one bit line sense amplifier array among the first bit line sense amplifier array and the second bit line sense amplifier array.

In accordance with still another embodiment of the present invention, a memory includes: a first cell array including a plurality of row lines, a plurality of first column lines, and a plurality of first memory cells, each of which is coupled to one row line among the row lines and one column line among the first column lines; a second cell array arranged adjacent to the first cell array, sharing the row lines with the first cell array, and including a plurality of second column lines and a plurality of second memory cells, each of which is coupled to one row line among the row lines and one column line among the second column lines; a third cell array arranged adjacent to the second cell array, sharing the row lines with the second cell array, and including a plurality of third column lines and a plurality of third memory cells, each of which is coupled to one row line among the row lines and one column line among the third column lines; a first even bit line sense amplifier array positioned on one side of the first cell array and suitable for amplifying data of the first memory cells corresponding to a selected row line and even first column lines among the first column lines; a first odd bit line sense amplifier array positioned on another side of the first cell array and suitable for amplifying data of the first memory cells corresponding to the selected row line and odd first column lines among the first column lines; a second even bit line sense amplifier array positioned on one side of the second cell array and suitable for amplifying data of the second memory cells corresponding to the selected row line and even second column lines among the second column lines; a second odd bit line sense amplifier array positioned on another side of the second cell array and suitable for amplifying data of the second memory cells corresponding to the selected row line and odd second column lines among the second column lines; a third even bit line sense amplifier array positioned on one side of the third cell array and suitable for amplifying data of the third memory cells corresponding to the selected row line and even third column lines among the third column lines; and a third odd bit line sense amplifier array positioned on another side of the third cell array and suitable for amplifying data of the third memory cells corresponding to the selected row line and odd third column lines among the third column lines.

In accordance with still another embodiment of the present invention, a memory includes: a cell array coupled to row lines and column lines, and including even number of sub-arrays sharing the row lines; odd groups of sense amplifiers, the odd groups being coupled to the respective sub-arrays through odd column lines among the column lines; even groups of sense amplifiers, the even groups being coupled to the respective sub-arrays through even column lines among the column lines; and a selector suitable for selecting and controlling first and second groups to exchange data with an external by sensing and amplifying the data on the column lines coupled thereto, wherein the first and second groups are one among pairs of adjacent groups within the odd or even groups.

In accordance with still another embodiment of the present invention, a memory includes: a cell array coupled to row lines and column lines and including even number of sub-arrays sharing the row lines; odd groups of sense amplifiers, the odd groups being coupled to the respective sub-arrays through odd column lines among the column lines; even groups of sense amplifiers, the even groups being coupled to the respective sub-arrays through even column lines among the column lines; and a selector suitable for selecting and controlling first and second groups to exchange data with an external by sensing and amplifying the data on the column lines coupled thereto, wherein the first and second groups are respectively one from the odd and even groups and separated from each other in a row direction by at least one of the sub-arrays.

DETAILED DESCRIPTION

Figure 1:
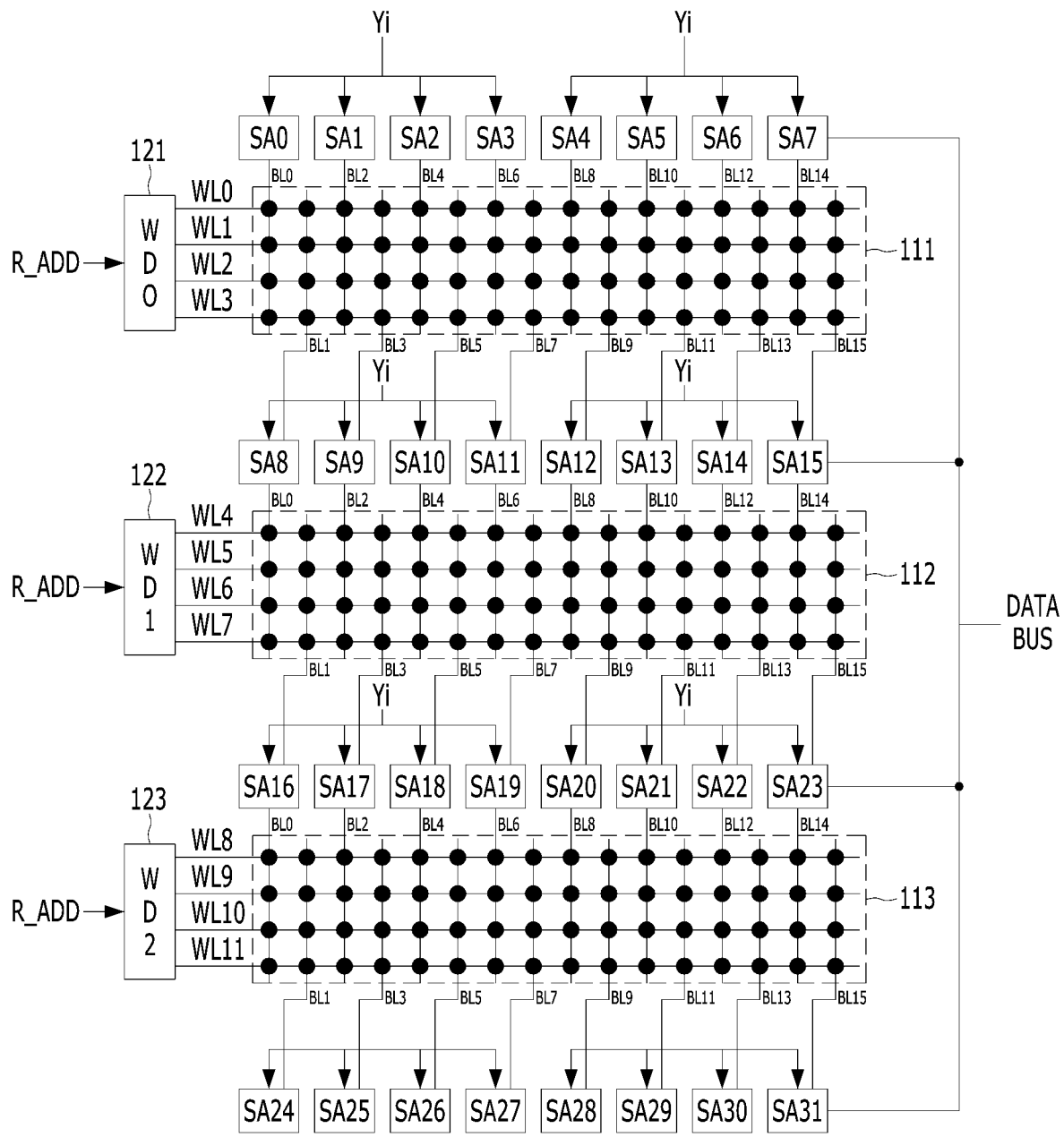
FIG. 1 is a schematic diagram illustrating a memory in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a schematic diagram illustrating a memory in accordance with an embodiment of the present invention.

Referring to FIG. 1, the memory may include cell arrays 111, 112, and 113, word line drivers 121, 122, and 123, and bit line sense amplifiers SA0 to SA23.

The cell arrays 111, 112, and 113 may include a plurality of row lines WL0 to WL11, a plurality of column lines BL0 to BL15, and a plurality of memory cells (illustrated as an array of black dots), each of which is coupled to one among the row lines WL0 to WL11 and one among the column lines BL0 to BL15. The row lines WL0 to WL11 may also be called word lines, and the column lines BL0 to BL15 may also be called bit lines. Each of the memory cells may include a transistor which serves as a switch and a capacitor for storing data.

The word line drivers 121, 122, and 123 may select and activate one row line among the row lines WL0 to WL11 by decoding a row address R_ADD during an active operation of the memory. Only one row line in one cell array among the cell arrays 111, 112, and 113 may be activated. For example, when the row line WL2 is activated by the word line driver 121, the other row lines WL0, WL1, and WL3 to WL11 may all be deactivated.

The bit line sense amplifiers SA0 to SA23 may sense and amplify the data of the memory cells of the selected row line during an active operation. Bit line sense amplifiers at the upper and lower ends of the cell array including the selected row line among the cell arrays 111, 112, and 113 may be simultaneously activated. For example, when the row line WL5 is activated, the bit line sense amplifiers SA8 to SA23 may be simultaneously activated to sense and amplify the data of the memory cells of the row line WL5. Also, when the row line WL10 is activated, the bit line sense amplifiers SA16 to SA31 may be simultaneously activated to sense and amplify the data of the memory cells of the row line WL10.

When the row line WL5 is activated, data of the memory cells corresponding to the row line WL5 and the column line BL0 may be sensed and amplified by the bit line sense amplifier SA8, and data of the memory cell corresponding to the row line WL5 and the column line BL1 may be sensed and amplified by the bit line sense amplifier SA16.

The bit line sense amplifiers SA0 to SA23 may be grouped by four to receive the same column selection signal Yi. The column selection signal Yi may be a signal for controlling the connection between the bit line sense amplifiers SA0 to SA23 and the data bus DATA_BUS. When the column selection signal Yi which is input to the bit line sense amplifiers SA8 to SA11 is activated, the data sensed and amplified by the bit line sense amplifiers SA8 to SA11 may be output to the data bus DATA BUS, or the data of the data bus DATA BUS may be input to the bit line sense amplifiers SA8 to SA11. Here, the data bus DATA BUS may be a data bus inside the memory for transferring the data of the cell arrays to the data output circuit or transferring the data received by the data receiving circuit to the cell arrays.

Although FIG. 1 shows each of the cell arrays 111, 112, and 113 includes 4 row lines and 16 column lines, each of the cell arrays 111, 112, and 113 may include more row lines and more column lines.

Figure 2:
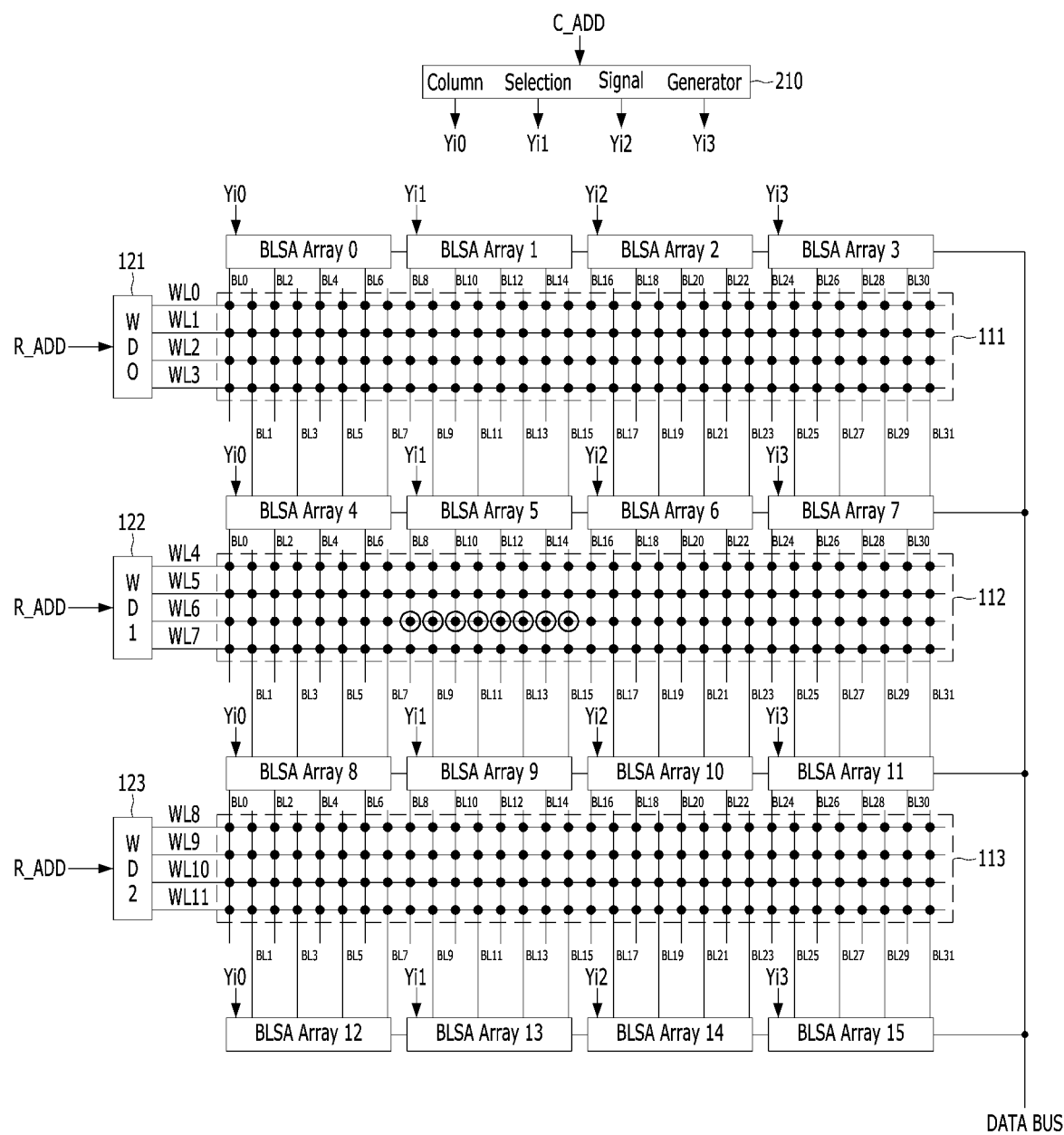
FIG. 2 is a schematic diagram illustrating a first detailed example of the memory shown in FIG. 1 in accordance with an embodiment of the present invention.

FIG. 2 is a schematic diagram illustrating a first detailed example of the memory shown in FIG. 1 in accordance with an embodiment of the present invention.

Referring to FIG. 2, illustrated are a greater number of the column lines BL0 to BL31 coupled to the cell arrays 111, 112, and 113.

Also, in FIG. 2, four bit line sense amplifiers receiving the same column selection signal Yi are grouped into one block and shown as a bit line sense amplifier array. For example, the four bit line sense amplifiers SA0 to SA3 shown in FIG. 1 are shown as a bit line sense amplifier array 0 (BLSA Array 0), and the four bit line sense amplifiers SA12 to SA15 are shown as a bit line sense amplifier array 5 (BLSA Array 5).

A column selection signal generator 210 may activate one column selection signal among column selection signals Yi0 to Yi3 by decoding a column address C_ADD during read and write operations. The column selection signal Yi0 may be input to the bit line sense amplifier array 0 (BLSA Array 0), the bit line sense amplifier array 4 (BLSA Array 4), the bit line sense amplifier array 8 (BLSA Array 8), and the bit line sense amplifier array 12 (BLSA Array 12). Also, the column selection signal Yi1 may be input to a bit line sense amplifier array 1 (BLSA Array 1), a bit line sense amplifier array 5 (BLSA Array 5), a bit line sense amplifier array 9 (BLSA Array 9), and a bit line sense amplifier array 13 (BLSA Array 13). Also, the column selection signal Yi2 may be input to a bit line sense amplifier array 2 (BLSA Array 2), a bit line sense amplifier array 6 (BLSA Array 6), a bit line sense amplifier array 10 (BLSA Array 10), and a bit line sense amplifier array 14 (BLSA Array 14). Also, the column selection signal Yi3 may be input to a bit line sense amplifier array 3 (BLSA Array 3), a bit line sense amplifier array 7

(BLSA Array 7), a bit line sense amplifier array 11 (BLSA Array 11), and a bit line sense amplifier array 15 (BLSA Array 15).

Hereafter, an active operation, a read operation, and a write operation of the memory of FIG. 2 will be described.

Active Operation of the Memory Shown in FIG. 2

During an active operation, the word line drivers 121, 122, and 123 may activate a row line which is selected based on a row address R_ADD. Herein, a row line WL6 is selected and activated based on the row address R_ADD. Since only one row line WL6 is selected during an active operation, the other row lines WL0 to WL5 and WL7 to WL11 may be deactivated.

Since the row line WL6 of the cell array 112 is selected, the bit line sense amplifier arrays (BLSA Array 4 to BLSA Array 11) at the top and bottom of the cell array 112 may be activated to sense and amplify the data of the memory cells of the row line WL6. In this case, the other bit line sense amplifier arrays (BLSA Array 0 to BLSA Array 3, and BLSA Array 12 to BLSA Array 15) may be deactivated.

The activation of the row line WL6 and the activation of the bit line sense amplifier arrays (BLSA Array 4 to BLSA Array 11) may continue until a precharge operation that ends an active operation.

Read Operation of the Memory Shown in FIG. 2

A read operation may be performed while the memory is active.

During a read operation, the column selection signal generator 210 may decode the column address C_ADD to activate one column selection signal among the column selection signals Yi0 to Yi3. Herein, the column selection signal Yi1 is activated. When the column selection signal Yi1 is activated, the data amplified by the bit line sense amplifier arrays (BLSA Array 5 and BLSA Array 9) receiving the column selection signal Yi1 may be transferred to the data bus DATA BUS, and the data of the data bus DATA BUS may be transferred to a memory controller through a data output circuit (not shown) of the memory. The bit line sense amplifier arrays (BLAS Array 1 and BLSA Array 13) may also receive the column selection signal Yi1, but since they are in an inactive state, the data may not be transferred from the bit line sense amplifier arrays (BLAS Array 1 and BLSA Array 13) to the data bus DATA BUS.

FIG. 2 shows the memory cells (illustrated as black dots embraced by circles), from which data is read within the cell array 112. It may be seen that the data is read from the eight memory cells corresponding to the row line WL6 and the column lines BL8 to BL15. Herein, the data may be read from eight consecutive memory cells, which may increase the possibility of an uncorrectable error in the memory. In terms of the structure of the cell array 112, a defect called a storage node bridge may be likely to occur between the memory cells of the neighboring column lines. For example, a storage node bridge defect may occur between the memory cells of the row line WL6 and the column lines BL8 and BL9, and a storage node bridge defect may occur between the memory cells of the row line WL6 and the column lines BL10 and BL11. When a storage node bridge defect occurs, errors may occur in two related memory cells at the same time. In other words, when a storage node bridge defect occurs, errors may occur in 2 bits among 8 bits of data belonging to the same data chunk which is read from memory. Herein, the data chunk may refer to a data unit that is input/output to/from the memory during one read or write operation.

In general, an error correction operation may be performed on the data read from the memory inside the memory, or after the data read from the memory is transferred to a memory controller, an error correction operation may be performed. When an error of 1 bit exists in the same data chunk, the error may be corrected, but when an error of 2 bits exists in the same data chunk, the error may not be corrected. Therefore, it may be very important to reduce the number of errors occurring in one data chunk.

Write Operation of the Memory Shown in FIG. 2

A write operation of the memory may be performed while the memory is active.

During a write operation, the column selection signal generator 210 may decode a column address C_ADD to activate one column selection signal among the column selection signals Yi0 to Yi3.

Herein, the column selection signal Yi1 is activated. When the column selection signal Yi1 is activated, the bit line sense amplifier arrays (BLSA Array 5 and BLSA array 9) receiving the column selection signal Yi1 may be coupled to the data bus DATA BUS, and the data of the data bus DATA BUS, which are write data transferred from the memory controller to the memory, may be transferred to the bit line sense amplifier arrays (BLSA Array 5 and BLSA Array 9) to be written into eight memory cells shown in the drawing. During a write operation, just as in the read operation, data of eight consecutive memory cells may be included in one data chunk, which may also increase the possibility of an uncorrectable error in the memory.

A write operation may be performed similarly to the read operation except that the direction in which data are transferred is different.

Figure 3:
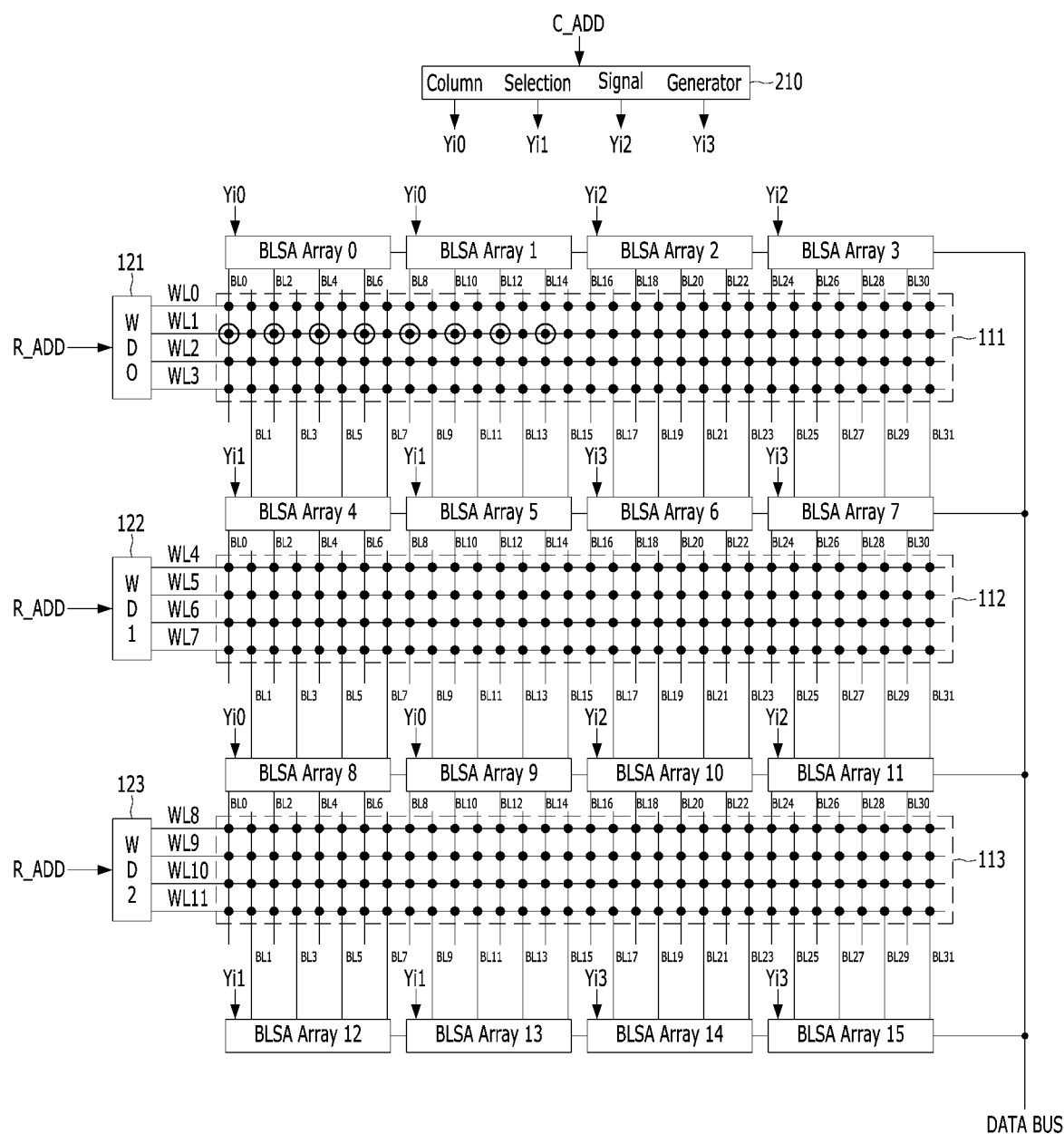
FIG. 3 is a schematic diagram illustrating a second detailed example of the memory shown in FIG. 1 in accordance with an embodiment of the present invention.

FIG. 3 is a schematic diagram illustrating a second detailed example of the memory shown in FIG. 1 in accordance with an embodiment of the present invention.

In the embodiment of FIG. 3, it may be seen that the corresponding relationship between the column selection signals Yi0 to Yi3 and the bit line sense amplifier arrays (BLSA Array 0 to BLSA Array 15) may be different from the embodiment of FIG. 2.

Referring to FIG. 3, the column selection signal Yi0 may be input to the bit line sense amplifier arrays (BLSA Array 0, BLSA Array 1, BLSA Array 8, and BLSA Array 9). Also, the column selection signal Yi1 may be input to the bit line sense amplifier arrays (BLSA Array 4, BLSA Array 5, BLSA Array 12, and BLSA Array 13). Also, the column selection signal Yi2 may be input to the bit line sense amplifier arrays (BLSA Array 2, BLSA Array 3, BLSA Array 10, and BLSA Array 11). Also, the column selection signal Yi3 may be input to the bit line sense amplifier arrays (BLSA Array 6, BLSA Array 7, BLSA Array 14, and BLSA Array 15).

Hereafter, an active operation, a read operation and a write operation of the memory shown in FIG. 3 will be described.

Active Operation of the Memory Shown in FIG. 3

During an active operation, the word line drivers 121, 122, and 123 may activate a row line selected based on the row address R_ADD. Herein, the row line WL1 is selected and activated based on the row address R_ADD. Since only one row line WL1 is selected during an active operation, the other row lines WL0, WL2 to WL11 may be all deactivated.

Since the row line WL1 of the cell array 111 is selected, the bit line sense amplifier arrays (BLSA Array 0 to BLSA Array 7) at the top and bottom of the cell array 111 may be activated to sense and amplify the data of memory cells. Herein, the other bit line sense amplifier arrays (BLSA Array 8 to BLSA Array 15) may be deactivated.

The activation of the row line WL1 and the activation of the bit line sense amplifier arrays (BLSA Array 0 to BLSA Array 7) may continue until a precharge operation that ends an active operation.

Read Operation of the Memory Shown in FIG. 3

A read operation may be performed while the memory is active.

During a read operation, the column selection signal generator 210 may activate one among the column selection signals Yi0 to Yi3 by decoding the column address C_ADD. Herein, the column selection signal Yi0 is activated. When the column selection signal Yi0 is activated, the data amplified by the bit line sense amplifier arrays (BLSA Array 0 and BLSA Array 1) receiving the column selection signal Yi0 may be transferred to the data bus DATA BUS, and the data of the data bus DATA BUS may be transferred to a memory controller through a data output circuit (not shown) of the memory. The bit line sense amplifier arrays (BLAS Array 8 and BLSA Array 9) may also receive the column selection signal Yi0, but since they are in an inactive state, the data may not be transferred from the bit line sense amplifier arrays (BLAS Array 8 and BLSA Array 9) to the data bus DATA BUS.

FIG. 3 shows memory cells (illustrated as black dots embraced by circles), from which data is read within the cell array 111. It may be seen that the data is read from eight memory cells corresponding to the row line WL1 and the column lines BL0, BL2, BL4, BL6, BL8, BL10, BL12, and BL14. In other words, data may be read only from the even lines BL0, BL2, BL4, BL6, BL8, BL10, BL12, and BL14 among the column lines, and data may not be read from the odd lines BL1, BL3, BL5, BL7, BL9, BL11, BL13, and BL15. Since data are not output from memory cells belonging to the neighboring columns, even though a storage node bridge defect occurs, a 2-bit error may not occur in one data chunk and only a 1-bit error may occur. In other words, even though a storage node bridge defect occurs, only a 1-bit error occurs in one data chunk. Since the 1-bit error may be easily corrected by an error correction operation of the memory or an error correction operation of the memory controller, the stability of the memory system may not be affected. In the case where the memory is formed as shown in FIG. 3, data may be read only from the even lines among the column lines or data may be read only from the odd lines during a read operation. Therefore, memory cells corresponding to the column lines that are adjacent to one data chunk may not be included.

Even though any of the column selection signals Yi1 to Yi3 other than the column selection signal Yi0 are activated, data of memory cells corresponding to adjacent column lines may not be included in one data chunk as well. For example, when the column selection signal Yi1 is activated, the data amplified by the bit line sense amplifier arrays (BLSA Array 4 and BLSA Array 5) receiving the column selection signal Yi1 may be transferred to the data bus DATA BUS, and the data of the data bus DATA BUS may be transferred to the memory controller through a data output circuit (not shown) of the memory. In this case, the data may be read from eight memory cells corresponding to the row line WL1 and the column lines BL1, BL3, BL5, BL7, BL9, BL11, BL13, and BL15. Since data are read only from the odd lines BL1, BL3, BL5, BL7, BL9, BL11, BL13, and BL15, data of the memory cells belonging to the neighboring columns may not be included in one data chunk.

In the memory having the structure as shown in FIG. 3, during a read operation data may be output only from the bit line sense amplifier arrays at the upper end of the cell array on which the read operation is performed, or data may be output only from the bit line sense amplifier arrays at the lower end of the cell array. Therefore, the data of the memory cells belonging to the neighboring columns may not be included in one data chunk.

Write Operation of the Memory Shown in FIG. 3

A write operation may be performed while the memory is active. The write operation may be performed similarly to a read operation, except that the direction in which data are transferred is different.

When the column selection signal Yi0 is activated during a write operation, data may be written in the eight memory cells corresponding to the row line WL1 and the column lines BL0, BL2, BL4, BL6, BL8, BL10, BL12, and BL14. Also, when the column selection signal Yi1 is activated, data may be written to the eight memory cells corresponding to the row line WL1 and the column lines BL1, BL3, BL5, BL7, BL9, BL11, BL13, and BL15.

Even during a write operation, data written in the memory cells belonging to the neighboring columns may not configure one data chunk.

Figure 4:
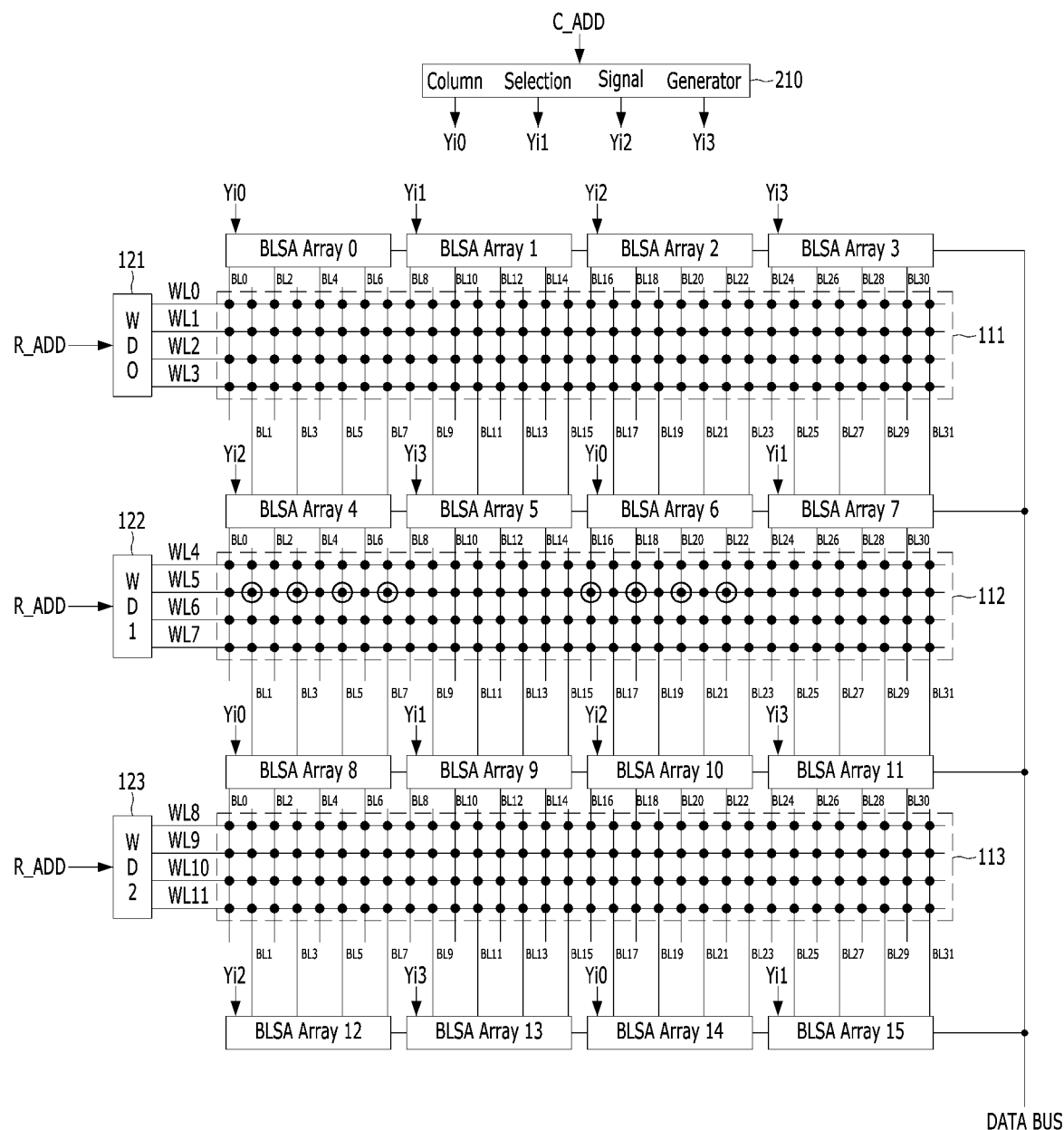
FIG. 4 is a schematic diagram illustrating a third detailed example of the memory shown in FIG. 1 in accordance with an embodiment of the present invention.

FIG. 4 is a schematic diagram illustrating a third detailed example of the memory shown in FIG. 1 in accordance with an embodiment of the present invention.

It may be seen from the embodiment of FIG. 4 that the correspondence between the column selection signals Yi0 to Yi3 and the bit line sense amplifier arrays (BLSA Array 0 to BLSA Array 15) is different from the embodiments of FIGS. 1 and 2.

Referring to FIG. 4, the column selection signal Yi0 may be input to the bit line sense amplifier arrays (BLSA Array 0, BLSA Array 6, BLSA Array 8, and BLSA Array 14). Also, the column selection signal Yi1 may be input to the bit line sense amplifier arrays (BLSA Array 1, BLSA Array 7, BLSA Array 9, and BLSA Array 15). Also, the column selection signal Yi2 may be input to the bit line sense amplifier arrays (BLSA Array 2, BLSA Array 4, BLSA Array 10, and BLSA Array 12). Also, the column selection signal Yi3 may be input to the bit line sense amplifier arrays (BLSA Array 3, BLSA Array 5, BLSA Array 11, and BLSA Array 13).

Hereafter, an active operation, a read operation, and a write operation of the memory shown in FIG. 4 will be described.

Active Operation of the Memory Shown in FIG. 4

During an active operation, the word line drivers 121, 122, and 123 may activate a row line which is selected based on the row address R_ADD. Herein, the row line WL5 is selected and activated based on the row address R_ADD. Since only one row line WL5 is selected during an active operation, the other row lines WL1 to WL4 and WL6 to WL11 may be all deactivated.

Since the row line WL5 of the cell array 112 is selected, the bit line sense amplifier arrays (BLSA Array 4 to BLSA Array 11) at the upper and lower ends of the cell array 112 may be activated to sense and amplify the data of the memory cells of the row line WL5. In this case, the other bit line sense amplifier arrays (BLSA Array 0 to BLSA Array 3, and BLSA Array 11 to BLSA Array 15) may be deactivated.

The activation of the row line WL5 and the activation of the bit line sense amplifier arrays (BLSA Array 4 to BLSA Array 11) may last until a precharge operation that ends an active operation.

Read Operation of the Memory Shown in FIG. 4

A read operation may be performed while the memory is active.

During a read operation, the column selection signal generator 210 may activate one column selection signal among the column selection signals Yi0 to Yi3 by decoding the column address C_ADD. Herein, the column selection signal Yi0 is activated. When the column selection signal Yi0 is activated, the data amplified by the bit line sense amplifier arrays (BLSA Array 6 and BLSA Array 8) receiving the column selection signal Yi0 may be transferred to the data bus DATA BUS, and the data of the data bus DATA BUS may be transferred to the memory controller through a data output circuit (not shown) of the memory. The bit line sense amplifier arrays (BLAS Array 8 and BLSA Array 9) may also receive the column selection signal Yi0, but since they are in an inactive state, data may not be transferred from the bit line sense amplifier arrays (BLAS Array 8 and BLSA Array 9) to the data bus DATA BUS.

FIG. 4 shows memory cells (illustrated as black dots embraced by circles), from which data is read within the cell array 112. It may be seen that the data is read from eight memory cells corresponding to the row line WL5 and the column lines BL1, BL3, BL5, BL7, BL16, BL18, BL20, and BL22. Since all of the accessed column lines BL1, BL3, BL5, BL7, BL16, BL18, BL20, and BL22 are not adjacent to each other, even though a storage node bridge defect occurs, a 2-bit error may not occur in one data chunk and only a 1-bit error may occur. In other words, even though a storage node bridge defect occurs, only a 1-bit error occurs in one data chunk. Since the 1-bit error may be easily corrected by an error correction operation of the memory or an error correction operation of the memory controller, the stability of the memory system may not be affected. In the case of forming the memory as shown in FIG. 4, since the column lines accessed during a read operation are not positioned adjacent to each other but distributed, the memory cells corresponding to the column lines adjacent to one data chunk may not be included.

Even though any of the column selection signals Yi1 to Yi3 other than the column selection signal Yi0 are activated, data of memory cells corresponding to adjacent column lines may not be included in one data chunk. When the column selection signal Yi1 is activated, the data may be read from the eight memory cells corresponding to the row line WL5 and the column lines BL9, BL11, BL13, BL15, BL24, BL26, BL28, and BL30. When the column selection signal Yi2 is activated, the data may be read from the eight memory cells corresponding to the row line WL5 and the column lines BL0, BL2, BL4, BL6, BL17, BL19, BL21, and BL23. Also, when the column selection signal Yi3 is activated, the data may be read from the eight memory cells corresponding to the row line WL5 and the column lines BL8, BL10, BL12, BL14, BL25, BL27, BL29, and BL31. Even though a certain column selection signal is activated, it may be seen that the data of the memory cells of a neighboring column are not read.

Write Operation of the Memory Shown in FIG. 4

A write operation may be performed while the memory is active. A write operation may be performed similarly to the read operation except that the direction in which data are transferred is different.

When the column selection signal Yi0 is activated during a write operation, data may be written into the eight memory cells corresponding to the row line WL5 and the column lines BL1, BL3, BL5, BL7, BL16, BL18, BL20, and BL22. When the column selection signal Yi1 is activated, data may be written to the eight memory cells corresponding to the row line WL5 and the column lines BL9, BL11, BL13, BL15, BL24, BL26, BL28, and BL30. When the column selection signal Yi2 is activated, data may be written to the eight memory cells corresponding to the row line WL5 and the column lines BL0, BL2, BL4, BL6, BL17, BL19, BL21, and BL23. Also, when the column selection signal Yi3 is activated, data may be written to the eight memory cells corresponding to the row line WL5 and the column lines BL8, BL10, BL12, BL14, BL25, BL27, BL29, and BL31.

Even during a write operation, data written in the memory cells belonging to the neighboring columns may not configure one data chunk.

According to the embodiment of the present invention, the efficiency of error correction in a memory may be increased.

The effects desired to be obtained in the embodiments of the present invention are not limited to the effects mentioned above, and other effects not mentioned above may also be clearly understood by those of ordinary skill in the art to which the present invention pertains from the description below.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A memory, comprising:
   a first cell array including a plurality of row lines, a plurality of first column lines, and a plurality of first memory cells, each of which is coupled to one row line among the row lines and one column line among the first column lines;
   a second cell array arranged adjacent to the first cell array, sharing the row lines with the first cell array, and including a plurality of second column lines and a plurality of second memory cells, each of which is coupled to one row line among the row lines and one column line among the second column lines;
   a third cell array arranged adjacent to the second cell array, sharing the row lines with the second cell array, and including a plurality of third column lines and a plurality of third memory cells, each of which is coupled to one row line among the row lines and one column line among the third column lines;
   a first even bit line sense amplifier array positioned on one side of the first cell array and suitable for amplifying data of the first memory cells corresponding to a selected row line and even first column lines among the first column lines;
   a first odd bit line sense amplifier array positioned on another side of the first cell array and suitable for amplifying data of the first memory cells corresponding to the selected row line and odd first column lines among the first column lines;
   a second even bit line sense amplifier array positioned on one side of the second cell array and suitable for amplifying data of the second memory cells corresponding to the selected row line and even second column lines among the second column lines;
   a second odd bit line sense amplifier array positioned on another side of the second cell array and suitable for amplifying data of the second memory cells corresponding to the selected row line and odd second column lines among the second column lines;
   a third even bit line sense amplifier array positioned on one side of the third cell array and suitable for amplifying data of the third memory cells corresponding to the selected row line and even third column lines among the third column lines; and a third odd bit line sense amplifier array positioned on another side of the third cell array and suitable for amplifying data of the third memory cells corresponding to the selected row line and odd third column lines among the third column lines, wherein during a read operation, each of the first odd bit line sense amplifier array and the third even bit line sense amplifier array is suitable for outputting data therefrom, and wherein during the read operation, each of the first even bit line sense amplifier array, the second even bit line sense amplifier array, the second odd bit line sense amplifier array, and the third odd bit line sense amplifier array is suitable for preventing output of data therefrom.

2. A memory, comprising:

a first cell array including a plurality of row lines, a plurality of first column lines, and a plurality of first memory cells, each of which is coupled to one row line among the row lines and one column line among the first column lines;

a second cell array arranged adjacent to the first cell array, sharing the row lines with the first cell array, and including a plurality of second column lines and a plurality of second memory cells, each of which is coupled to one row line among the row lines and one column line among the second column lines;

a third cell array arranged adjacent to the second cell array, sharing the row lines with the second cell array, and including a plurality of third column lines and a plurality of third memory cells, each of which is coupled to one row line among the row lines and one column line among the third column lines;

a first even bit line sense amplifier array positioned on one side of the first cell array and suitable for amplifying data of the first memory cells corresponding to a selected row line and even first column lines among the first column lines;

a first odd bit line sense amplifier array positioned on another side of the first cell array and suitable for amplifying data of the first memory cells corresponding to the selected row line and odd first column lines among the first column lines;

a second even bit line sense amplifier array positioned on one side of the second cell array and suitable for amplifying data of the second memory cells corresponding to the selected row line and even second column lines among the second column lines;

a second odd bit line sense amplifier array positioned on another side of the second cell array and suitable for amplifying data of the second memory cells corresponding to the selected row line and odd second column lines among the second column lines;

a third even bit line sense amplifier array positioned on one side of the third cell array and suitable for amplifying data of the third memory cells corresponding to the selected row line and even third column lines among the third column lines; and a third odd bit line sense amplifier array positioned on another side of the third cell array and suitable for amplifying data of the third memory cells corresponding to the selected row line and odd third column lines among the third column lines, wherein during a read operation, each of the first even bit line sense amplifier array and the third odd bit line sense amplifier array is suitable for outputting data therefrom, and wherein during the read operation, each of the first odd bit line sense amplifier array, the second even bit line sense amplifier array, the second odd bit line sense amplifier array, and the third even bit line sense amplifier array is suitable for preventing output of data therefrom.

3. A memory, comprising:

a first cell array including a plurality of row lines, a plurality of first column lines, and a plurality of first memory cells, each of which is coupled to one row line among the row lines and one column line among the first column lines;

a second cell array arranged adjacent to the first cell array, sharing the row lines with the first cell array, and including a plurality of second column lines and a plurality of second memory cells, each of which is coupled to one row line among the row lines and one column line among the second column lines;

a third cell array arranged adjacent to the second cell array, sharing the row lines with the second cell array, and including a plurality of third column lines and a plurality of third memory cells, each of which is coupled to one row line among the row lines and one column line among the third column lines;

a first even bit line sense amplifier array positioned on one side of the first cell array and suitable for amplifying data of the first memory cells corresponding to a selected row line and even first column lines among the first column lines;

a first odd bit line sense amplifier array positioned on another side of the first cell array and suitable for amplifying data of the first memory cells corresponding to the selected row line and odd first column lines among the first column lines;

a second even bit line sense amplifier array positioned on one side of the second cell array and suitable for amplifying data of the second memory cells corresponding to the selected row line and even second column lines among the second column lines;

a second odd bit line sense amplifier array positioned on another side of the second cell array and suitable for amplifying data of the second memory cells corresponding to the selected row line and odd second column lines among the second column lines;

a third even bit line sense amplifier array positioned on one side of the third cell array and suitable for amplifying data of the third memory cells corresponding to the selected row line and even third column lines among the third column lines; and a third odd bit line sense amplifier array positioned on another side of the third cell array and suitable for amplifying data of the third memory cells corresponding to the selected row line and odd third column lines among the third column lines, wherein the first even bit line sense amplifier array, the first odd bit line sense amplifier array, the second even bit line sense amplifier array, the second odd bit line sense amplifier array, the third even bit line sense amplifier array, and the third odd bit line sense amplifier array are further suitable for performing respective data amplification operations simultaneously.

4. The memory of claim 1, further comprising:

a fourth cell array arranged adjacent to the third cell array, sharing the row lines with the third cell array, and including a plurality of fourth column lines and a plurality of fourth memory cells, each of which is coupled to one row line among the row lines and one column line among the fourth column lines;

a fourth even bit line sense amplifier array positioned on one side of the fourth cell array and suitable for amplifying data of the fourth memory cells corresponding to the selected row line and even fourth column lines among the fourth column lines; and a fourth odd bit line sense amplifier array positioned on another side of the fourth cell array and suitable for amplifying data of the fourth memory cells corresponding to the selected row line and odd fourth column lines among the fourth column lines.

5. The memory of claim 4, wherein during a read operation, each of the second odd bit line sense amplifier array and the fourth even bit line sense amplifier array is suitable for outputting data therefrom, and wherein during the read operation, each of the first even bit line sense amplifier array, the first odd bit line sense amplifier array, the second even bit line sense amplifier array, the third even bit line sense amplifier array, the third odd bit line sense amplifier array, and the fourth odd bit line sense amplifier array is suitable for preventing output of data therefrom.

6. The memory of claim 5, wherein during a read operation, each of the second even bit line sense amplifier array and the fourth odd bit line sense amplifier array is suitable for outputting data therefrom, and wherein during the read operation, each of the first even bit line sense amplifier array, the first odd bit line sense amplifier array, the second odd bit line sense amplifier array, the third even bit line sense amplifier array, the third odd bit line sense amplifier array, and the fourth even bit line sense amplifier array is suitable for preventing output of data therefrom.

\* \* \* \* \*